United States Patent
Hasegawa et al.

(10) Patent No.: US 11,417,940 B2
(45) Date of Patent: Aug. 16, 2022

(54) ANTENNA MODULE AND COMMUNICATION DEVICE

(71) Applicant: Murata Manufacturing Co., Ltd., Kyoto (JP)

(72) Inventors: Yoshiaki Hasegawa, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 123 days.

(21) Appl. No.: 17/001,785

(22) Filed: Aug. 25, 2020

(65) Prior Publication Data
US 2020/0388901 A1    Dec. 10, 2020

Related U.S. Application Data

(63) Continuation of application No. PCT/JP2019/000486, filed on Jan. 10, 2019.

(30) Foreign Application Priority Data

Feb. 28, 2018    (JP) .............................. JP2018-035181

(51) Int. Cl.
*H01Q 1/02*    (2006.01)
*H01Q 21/06*    (2006.01)

(52) U.S. Cl.
CPC ............... *H01Q 1/02* (2013.01); *H01Q 21/06* (2013.01)

(58) Field of Classification Search
CPC ........ H01Q 1/02; H01Q 21/06; H01Q 1/2283; H01Q 21/065; H04B 1/38; H04B 1/3827;
(Continued)

(56) References Cited

U.S. PATENT DOCUMENTS

2009/0284415 A1    11/2009 Worl et al.
2009/0322643 A1    12/2009 Choundhury
(Continued)

FOREIGN PATENT DOCUMENTS

JP    H07-307605 A    11/1995
JP    2001-028413 A    1/2001
(Continued)

OTHER PUBLICATIONS

International Search Report for PCT/JP2019/000486 dated Feb. 19, 2019.
Written Opinion for PCT/JP2019/000486 dated Feb. 19, 2019.

*Primary Examiner* — Nguyen T Vo
(74) *Attorney, Agent, or Firm* — Pearne & Gordon LLP

(57) ABSTRACT

A first antenna element (1111) and a second antenna element (1121) are formed on a first dielectric substrate (131). The first antenna element (1111) is supplied with power from a first radio frequency element (191). The second antenna element (1121) is supplied with power from a second radio frequency element (192). The first dielectric substrate (131), the first radio frequency element (191) and the second radio frequency element (192), and a first heat dissipation member (120) are laminated in this order in a Z-axis direction that is a normal direction of the first dielectric substrate (131). When viewed in plan from the Z-axis direction, the first heat dissipation member (120) overlaps at least a part of the first radio frequency element (191) and at least a part of the second radio frequency element (192).

20 Claims, 15 Drawing Sheets

(58) Field of Classification Search
CPC ........... H04B 1/40; H01L 23/12; H01L 23/29; H01L 25/04; H01L 25/18; H01P 1/30
See application file for complete search history.

(56) References Cited

U.S. PATENT DOCUMENTS

| | | |
|---|---|---|
| 2011/0279190 A1 | 11/2011 | Liu et al. |
| 2014/0055956 A1* | 2/2014 | Nakamura ............... H04B 1/44 361/748 |
| 2016/0174357 A1* | 6/2016 | Paine .................... H05K 1/111 361/709 |
| 2017/0347490 A1* | 11/2017 | Romig ................. H01Q 21/061 |
| 2021/0075123 A1* | 3/2021 | Baek ................... H01Q 1/2283 |

FOREIGN PATENT DOCUMENTS

| | | |
|---|---|---|
| JP | 2005-203633 A | 7/2005 |
| JP | 2006-157066 A | 6/2006 |
| JP | 2010056839 A | 3/2010 |
| JP | 2015-211056 A | 11/2015 |
| WO | 2014/045671 A1 | 3/2014 |

* cited by examiner

ANTENNA MODULE AND COMMUNICATION DEVICE

This is a continuation of International Application No. PCT/JP2019/000486 filed on Jan. 10, 2019 which claims priority from Japanese Patent Application No. 2018-035181 filed on Feb. 28, 2018. The contents of these applications are incorporated herein by reference in their entireties.

BACKGROUND OF THE DISCLOSURE

Field of the Disclosure

The present disclosure relates to an antenna module and a communication device.

Description of the Related Art

There has hitherto been known a module that stabilizes the operation of an integrated circuit (IC) by discharging heat generated in the integrated circuit outside via a heat dissipation member. For example, Japanese Unexamined Patent Application Publication No. 2005-203633 (Patent Document 1) discloses a semiconductor device in which a heat dissipation body is formed on a back surface of a semiconductor chip. Heat generated in an active region on a front surface of the semiconductor chip is dissipated outside from a back surface of the semiconductor chip via the heat dissipation member. As a thickness of the semiconductor chip is reduced, it is possible to improve the heat dissipation efficiency.

Patent Document 1: Japanese Unexamined Patent Application Publication No. 2005-203633

BRIEF SUMMARY OF THE DISCLOSURE

In Patent Document 1, when a semiconductor device includes a plurality of semiconductor chips, a heat dissipation member is formed for each semiconductor chip. When such a configuration is applied to an antenna module for forming a radio wave having desired directivity (beamforming) by supplying power to a plurality of antenna elements in cooperation with a plurality of radio frequency elements, since heat is separately dissipated by the heat dissipation member for each radio frequency element, the temperature difference between the radio frequency elements easily occurs. As a result, the deviation in power supplied to the antenna elements by the radio frequency elements occurs, and the directivity of the radio wave actually radiated may deviate from the desired directivity.

The present disclosure has been made in order to solve the above-described problem, and an object thereof is to suppress the deviation of the directivity of the radio wave radiated by the antenna module from the desired directivity due to the temperature difference between the plurality of radio frequency elements.

An antenna module according to an embodiment of the present disclosure radiates a radio wave having directivity by a plurality of radio frequency elements including a first radio frequency element and a second radio frequency element operating in cooperation with each other. The antenna module includes a first dielectric substrate, a first antenna element, a second antenna element, and a first heat dissipation member. The first antenna element is formed on the first dielectric substrate. The first antenna element is supplied with power from the first radio frequency element. The second antenna element is formed on the first dielectric substrate. The second antenna element is supplied with power from the second radio frequency element. The first heat dissipation member transfers heat from the first radio frequency element and heat from the second radio frequency element outside. The first dielectric substrate, the first radio frequency element and the second radio frequency element, and the first heat dissipation member are laminated in this order in a first normal direction which is normal to the first dielectric substrate. When viewed in plan from the first normal direction, the first heat dissipation member overlaps at least a part of the first radio frequency element and at least a part of the second radio frequency element.

According to the antenna module of the embodiment of the present disclosure, the first heat dissipation member overlaps at least a part of the first radio frequency element and at least a part of the second radio frequency element. Temperatures of the first radio frequency element and the second radio frequency element are easily equalized via the first heat dissipation member. As a result, it is possible to suppress the deviation of the directivity of the radio wave radiated by the antenna module from the desired directivity.

DETAILED DESCRIPTION OF THE DISCLOSURE

Figure 1:
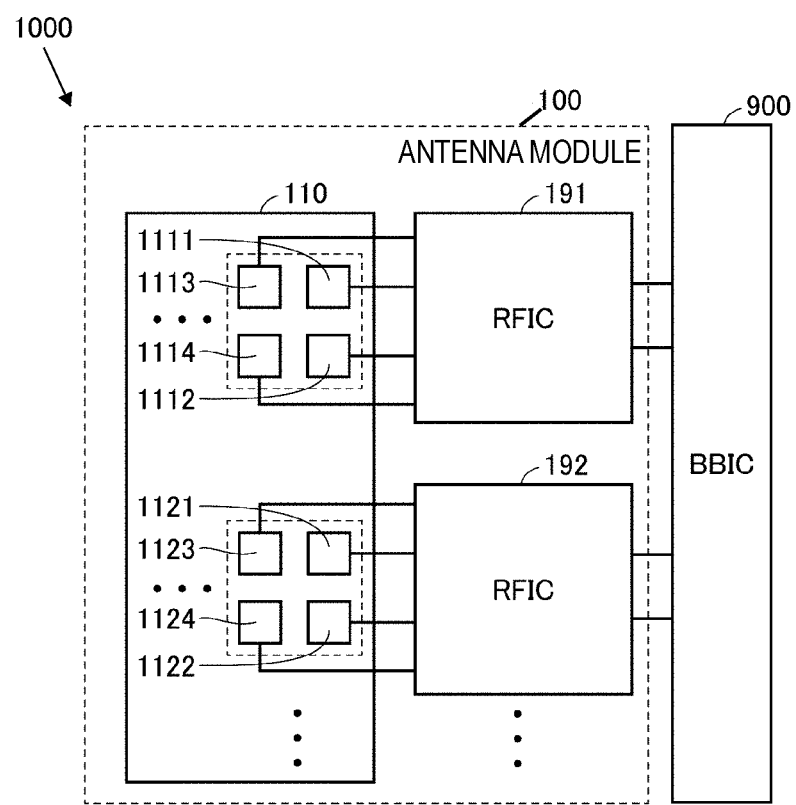
FIG. 1 is a block diagram of a communication device according to an embodiment.

Hereinafter, embodiments will be described in detail with reference to the accompanying drawings. Note that the same or corresponding portions in the drawings are denoted by the same reference numerals, and the description thereof will not be repeated in principle.

Embodiment 1

FIG. 1 is a block diagram of a communication device 1000 according to the embodiments. The communication device 1000 is, for example, a mobile terminal such as a mobile phone, a smartphone, a tablet, or the like or a personal computer having a communication function.

As illustrated in FIG. 1, the communication device 1000 includes an antenna module 100 and a baseband integrated circuit (BBIC) 900 that constitutes a baseband signal processing circuit. The antenna module 100 includes an antenna array 110 and radio frequency integrated circuits (RFICs) 191 and 192 which are examples of radio frequency elements. The antenna module 100 transmits and receives radio waves that are millimeter waves such as 28 GHz, 39 GHz, or 60 GHz.

The communication device 1000 up-converts a signal transmitted from the BBIC 900 to the antenna module 100 into a radio frequency signal and radiates the up-converted signal from the antenna array 110. The communication device 1000 down-converts a radio frequency signal received by the antenna array 110 and processes the down-converted signal with the BBIC 900.

In the antenna array 110, a plurality of flat plate-shaped antenna elements (radiation conductors) are regularly arranged. The antenna array 110 includes antenna elements 1111 to 1114 and 1121 to 1124.

The RFIC 191 supplies power to the antenna elements 1111 to 1114. The RFIC 192 supplies power to the antenna elements 1121 to 1124. The BBIC 900 causes the RFICs 191 and 192 to cooperate with each other to radiate a radio wave having desired directivity from the antenna array 110. Note that, in Embodiment 1, a case where one RFIC supplies power to four antenna elements will be described. However, the number of antenna elements to which one RFIC supplies power may be three or less, or five or more.

Figure 2:
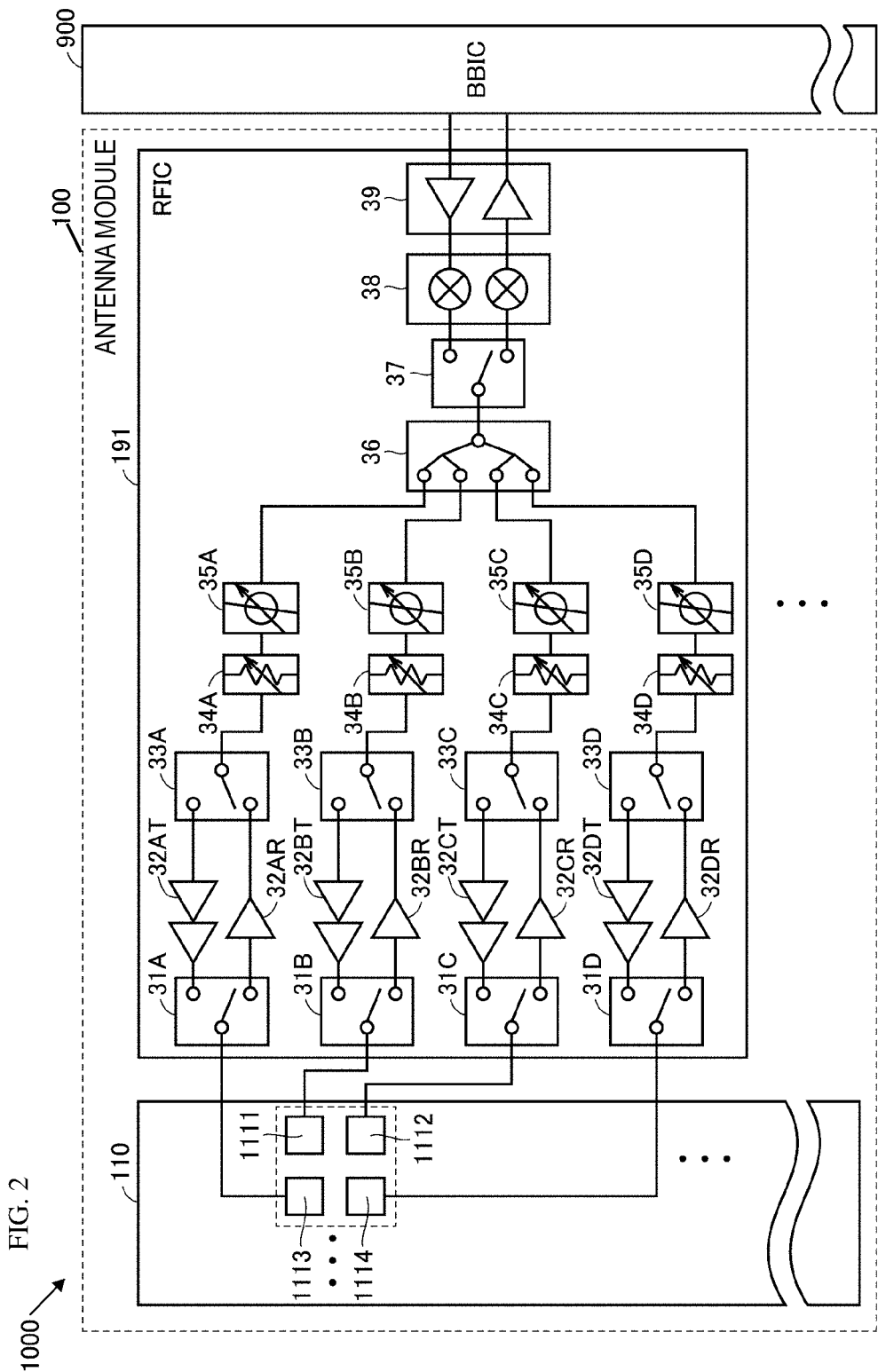
FIG. 2 is a block diagram illustrating a specific configuration of an RFIC in FIG. 1.

FIG. 2 is a block diagram illustrating a specific configuration of the RFIC 191 in FIG. 1. A configuration of the RFIC 192 is not illustrated in FIG. 2, but is the same as that of the RFIC 191. As illustrated in FIG. 2, the RFIC 191 includes switches 31A to 31D, 33A to 33D, and 37, power amplifiers 32AT to 32DT, low noise amplifiers 32AR to 32DR, attenuators 34A to 34D, phase shifters 35A to 35D, a signal multiplexer/demultiplexer 36, a mixer 38, and an amplifier circuit 39.

The RFIC 191 is formed as a one-chip integrated circuit component including, for example, circuit elements (switches, power amplifiers, low noise amplifiers, attenuators, and phase shifters) corresponding to the plurality of antenna elements included in the antenna array 110. Alternatively, the circuit element may be formed as a one-chip integrated circuit component for each antenna element, separately from the RFIC 191.

When a radio frequency signal is received, the switches 31A to 31D and 33A to 33D are switched to low noise amplifiers 32AR to 32DR sides, respectively, and the switch 37 is connected to a reception side amplifier of the amplifier circuit 39.

The radio frequency signals received by the antenna elements 1111 to 1114 pass through the respective signal paths from the switches 31A to 31D to the phase shifters 35A to 35D, are multiplexed by the signal multiplexer/demultiplexer 36, down-converted by the mixer 38, amplified by the amplifier circuit 39, and transmitted to the BBIC 900.

When a radio frequency signal is transmitted from the antenna array 110, the switches 31A to 31D and 33A to 33D are switched to power amplifiers 32AT to 32DT sides, respectively, and the switch 37 is connected to a transmission side amplifier of the amplifier circuit 39.

The signal transmitted from the BBIC 900 is amplified by the amplifier circuit 39 and up-converted by the mixer 38. The up-converted radio frequency signal is demultiplexed into four by the signal multiplexer/demultiplexer 36, and demultiplexed signals pass through the respective signal paths from the phase shifters 35A to 35D to the switches 31A to 31D and are supplied to the antenna elements 1111 to 1114. The directivity of the antenna array 110 can be adjusted by individually adjusting the degree of phase shift of each of the phase shifters 35A to 35D arranged in each of the signal paths.

Referring again to FIG. 1, the antenna module 100 requires a large number of antenna elements particularly in a case of millimeter wave application as compared with a case of lower frequency application. Since there is an upper limit on the number of antenna elements that can be connected to one RFIC, a plurality of RFICs are required for an antenna module for millimeter wave application. When the heat dissipation of RFIC 191 and the heat dissipation of RFIC 192 are separately performed by the heat dissipation members for the respective RFICs 191 and 192, a temperature difference easily occurs between the RFICs 191 and 192. As a result, since the power supplied to the antenna elements 1111 to 1114 from the RFIC 191 and the power supplied to the antenna elements 1121 to 1124 from the RFIC 192 vary, the directivity of the radio wave radiated by the antenna module 100 may deviate from the desired directivity.

Therefore, in Embodiment 1, the heat dissipation of the RFIC 191 and the heat dissipation of the RFIC 192 are performed in common by a heat dissipation member. The temperatures of the RFICs 191 and 192 are easily equalized in common via the heat dissipation member. Therefore, it is possible to suppress the variation in the power supplied to the antenna elements 1111 to 1114 from the RFIC 191 and the variation in the power supplied to the antenna elements 1121 to 1124 from the RFIC 192. As a result, it is possible to suppress the deviation of the directivity of the radio wave radiated by the antenna module from the desired directivity.

Figure 3:
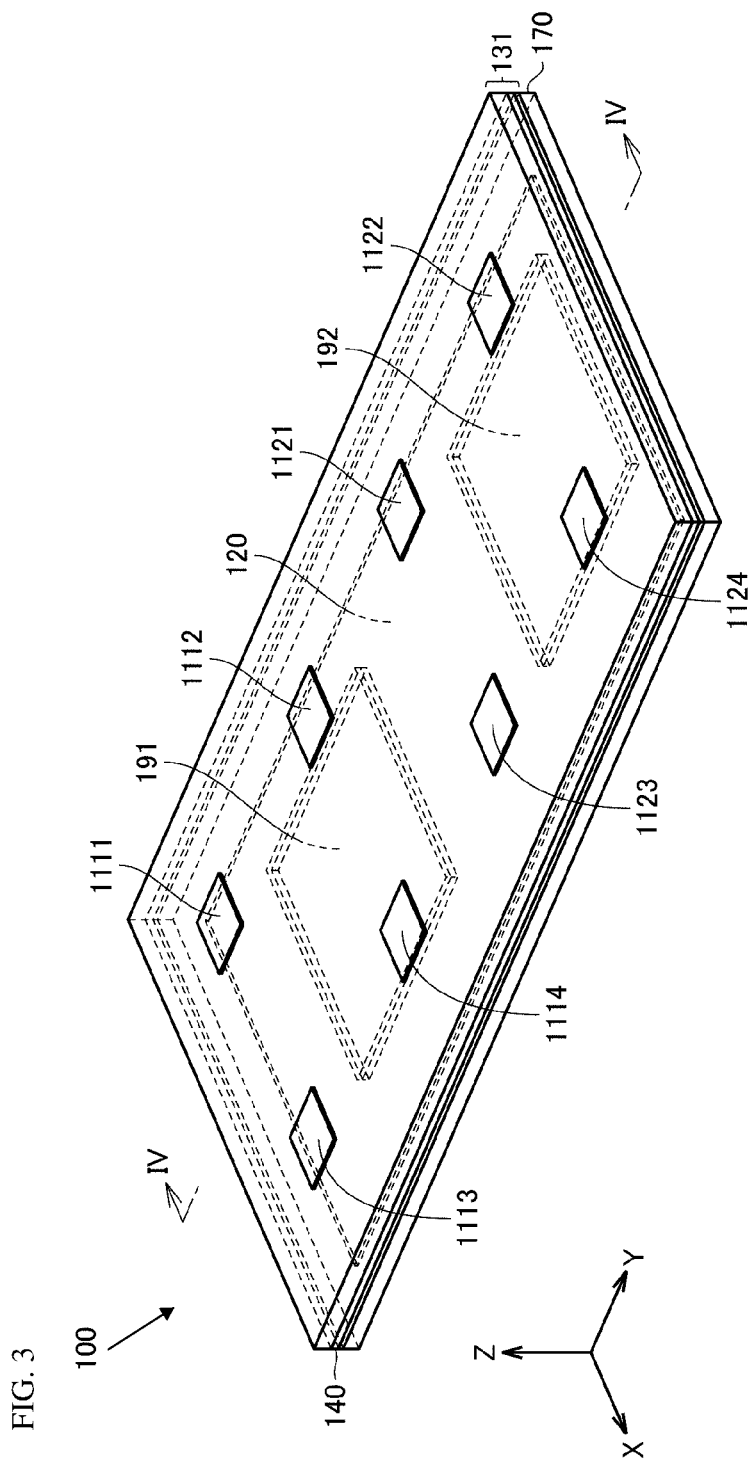
FIG. 3 is an external perspective view of an antenna module according to Embodiment 1.
Figure 4:
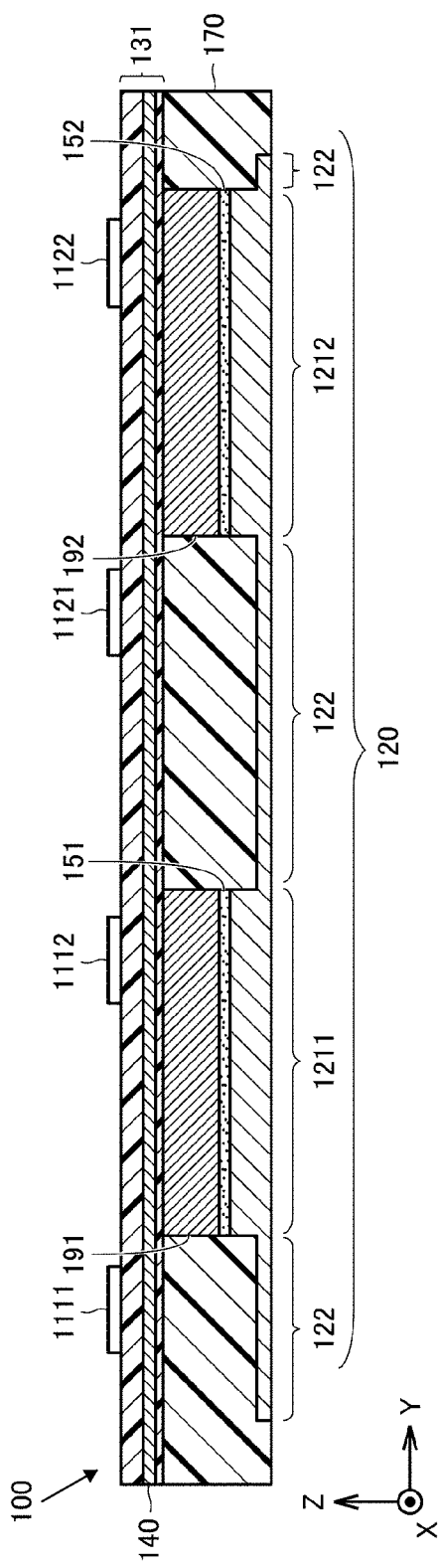
FIG. 4 is a sectional view taken along line IV-IV in FIG. 3.

FIG. 3 is an external perspective view of the antenna module 100 according to Embodiment 1. In FIGS. 1 to 3, the corresponding components are denoted by the same reference numerals. FIG. 4 is a sectional view taken along line IV-IV in FIG. 3. Hereinafter, the arrangement of the respective components of the antenna module 100 will be described with reference to FIGS. 3 and 4.

The antenna module 100 further includes, in addition to the antenna elements 1111 to 1114 (first antenna element), the antenna elements 1121 to 1124 (second antenna element), the RFIC 191 (first radio frequency element), and the RFIC 192 (second radio frequency element) illustrated in FIG. 1, a heat dissipation member 120 (first heat dissipation member), a dielectric substrate 131 (first dielectric substrate), and a mold layer 170.

In or at the mold layer 170, the heat dissipation member 120 and the RFICs 191 and 192 are sealed. The dielectric substrate 131 is laminated on the mold layer 170 with the Z-axis direction as a laminating direction. The RFICs 191 and 192 are arranged between the dielectric substrate 131 and the heat dissipation member 120. The dielectric substrate 131 has the Z-axis direction as a normal direction (first normal direction). A ground electrode 140 is formed in the dielectric substrate 131.

When viewed in plan from the Z-axis direction, the heat dissipation member 120 overlaps an entirety of the RFIC 191 and an entirety of the RFIC 192. The heat dissipation member 120 is formed of a material having a relatively high level of thermal conductivity, and transfers heat from the RFIC 191 and heat from the RFIC 192 outside. Since thermal conductivity of metal is relatively higher than that of other materials, it is desirable that the heat dissipation member 120 contain metal.

The antenna elements 1111 to 1114, and 1121 to 1124 are arranged in a matrix shape on the dielectric substrate 131, to form an antenna array. The antenna elements 1111, 1112, 1121, and 1122 are linearly arranged so as to be spaced apart from each other along the Y axis. The antenna elements 1111 and 1113 are arranged with a space therebetween along the X-axis. The antenna elements 1112 and 1114 are arranged with a space therebetween along the X-axis. The antenna elements 1121 and 1123 are arranged with a space therebetween along the X-axis. The antenna elements 1122 and 1124 are arranged with a space therebetween along the X-axis. The antenna elements 1113, 1114, 1123, and 1124 are linearly arranged so as to be spaced apart from each other along the Y axis.

The antenna elements 1111 to 1114 are connected to the RFIC 191 by a power supply line (not illustrated). The antenna elements 1121 to 1124 are connected to the RFIC 192 by a power supply line (not illustrated).

As illustrated in FIG. 4, the heat dissipation member 120 includes a portion 1211 (first portion), a portion 1212 (first portion), and a portion 122 (second portion). The portions 1211 and 1212 overlap the RFICs 191 and 192, respectively, when viewed in plan from the Z-axis direction. The portion 122 does not overlap the RFIC 191 or 192 when viewed in plan from the Z-axis direction. Thicknesses of the portions 1211 and 1212 in the Z-axis direction are larger than that of the portion 122. The portions 1211 and 1212 each form a convex shape. The portion 1211 is fixed to the RFIC 191 by an adhesive layer 151. The portion 1212 is fixed to the RFIC 192 by an adhesive layer 152.

In the antenna module 100, the heat dissipation of the RFIC 191 and the heat dissipation of the RFIC 192 are performed in common by the heat dissipation member 120. The temperatures of the RFICs 191 and 192 are easily equalized via the heat dissipation member 120. Therefore, it is possible to suppress the variation in the power supplied to the antenna elements 1111 to 1114 from the RFIC 191 and the variation in the power supplied to the antenna elements 1121 to 1124 from the RFIC 192. As a result, it is possible to suppress the deviation of the directivity of the radio wave radiated by the antenna module from the desired directivity.

In the antenna module 100, the thickness of the portion 122 that does not overlap the RFIC 191 or 192 when viewed from the Z-axis direction is smaller than the thicknesses of the portions 1211 and 1212 that overlap the RFICs 191 and 192, respectively, when viewed from the Z-axis direction. Thereby, a region thicker than the RFICs 191 and 192 is formed between the portion 122 and the dielectric substrate 131 by about a difference in thickness between the portion 122 and the portion 1211 (1212). Therefore, in the region, it is possible to arrange a circuit element thicker than the RFICs 191 and 192 as necessary within the range of about the difference in thickness between the portion 1211 (1212) and the portion 122. According to the antenna module 100, it is possible to effectively utilize the design space and to increase the degree of integration.

Modification 1 of Embodiment 1

Figure 5:
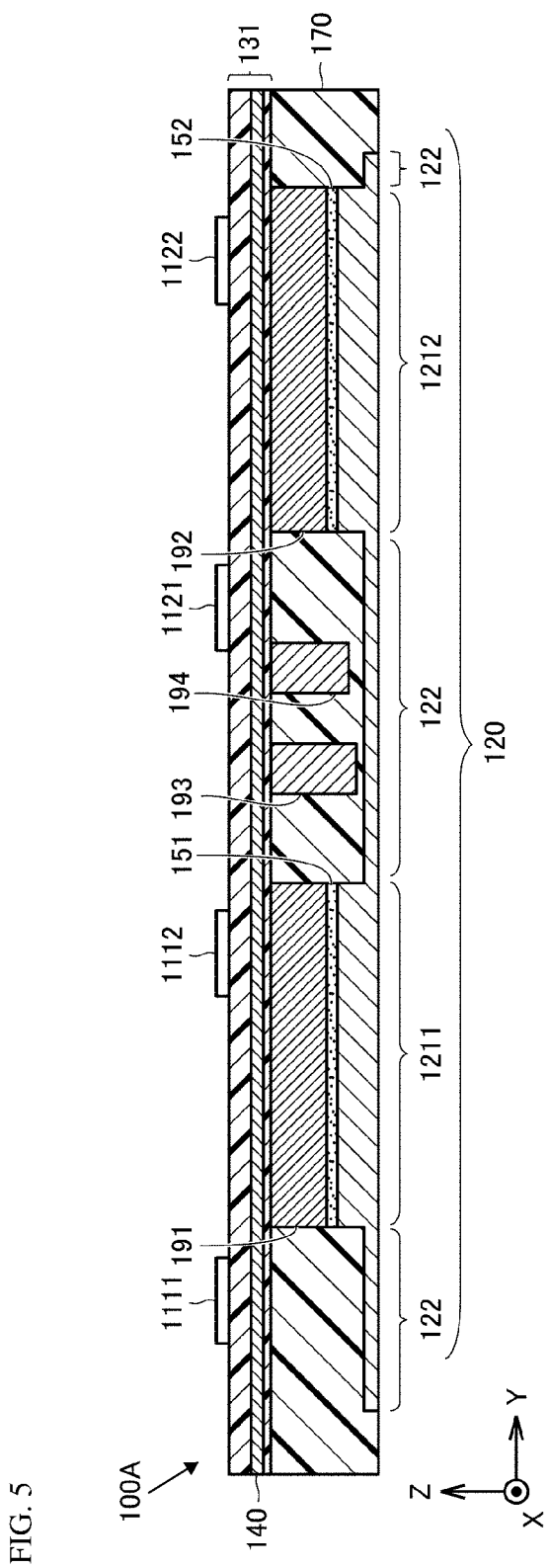
FIG. 5 is a sectional view of an antenna module according to Modification 1 of Embodiment 1.

FIG. 5 is a sectional view of an antenna module 100A according to Modification 1 of Embodiment 1. A configuration illustrated in FIG. 5 is a configuration in which circuit elements 193 and 194 are added to the configuration of the antenna module 100 illustrated in FIG. 4. The components other than those are the same, and therefore, the description will not be repeated.

As illustrated in FIG. 5, a region in which a width in the Z-axis direction is larger than the thicknesses of the RFICs 191 and 192 is formed between the portion 122 and the dielectric substrate 131. The circuit elements 193 and 194 are thicker than the RFICs 191 and 192. The circuit elements 193 and 194 are arranged between the portion 122, which is between the portions 1211 and 1212, and the dielectric substrate 131.

Modification 2 of Embodiment 1

In Embodiment 1, the case where the radio frequency element is fixed to the heat dissipation member via the adhesive layer has been described. A layer (for example, a dielectric substrate) other than the adhesive layer may be formed between the heat dissipation member and the radio frequency element.

Figure 6:
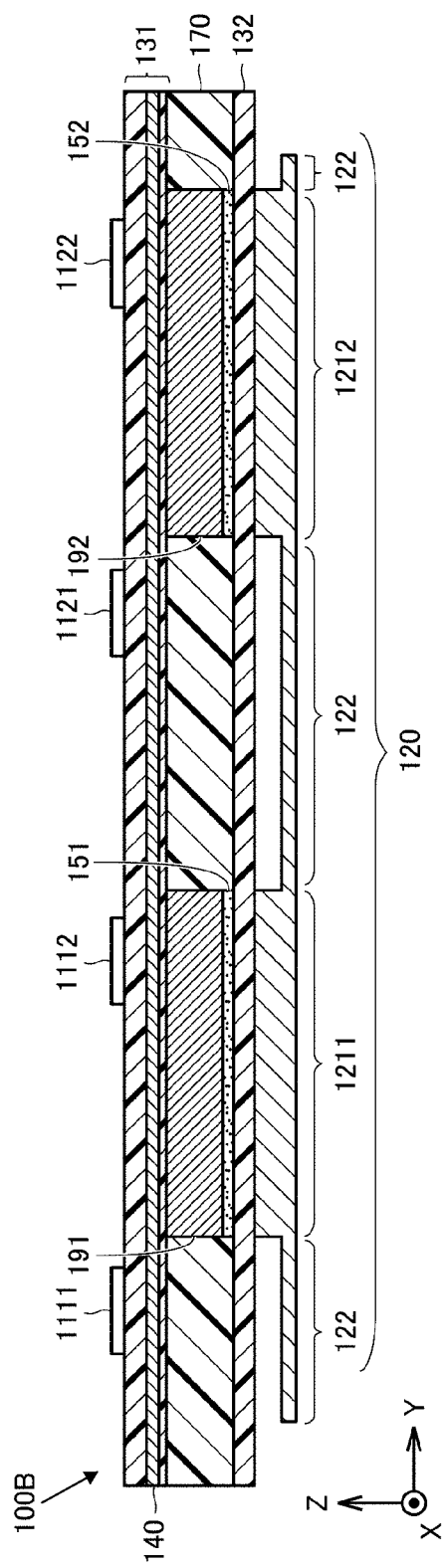
FIG. 6 is a sectional view of an antenna module according to Modification 2 of Embodiment 1.

FIG. 6 is a sectional view of an antenna module 100B according to Modification 2 of Embodiment 1. A configuration of an antenna module 100B illustrated in FIG. 6 is a configuration in which a dielectric substrate 132 is added to the configuration of the antenna module 100 illustrated in FIG. 4. The components other than this are the same, and therefore, the description will not be repeated.

As illustrated in FIG. 6, the dielectric substrate 132 is formed between the RFIC 191 and the heat dissipation member 120 and between the RFIC 192 and the heat dissipation member. The heat dissipation member 120 is fixed to the dielectric substrate 132. The RFICs 191 and 192 are fixed to the dielectric substrate 132 by the adhesive layers 151 and 152, respectively. The adhesive layer 151 and the dielectric substrate 132 are formed between the RFIC 191 and the heat dissipation member 120. The adhesive layer 152 and the dielectric substrate 132 are formed between the RFIC 192 and the heat dissipation member 120.

Modification 3 of Embodiment 1

Figure 7:
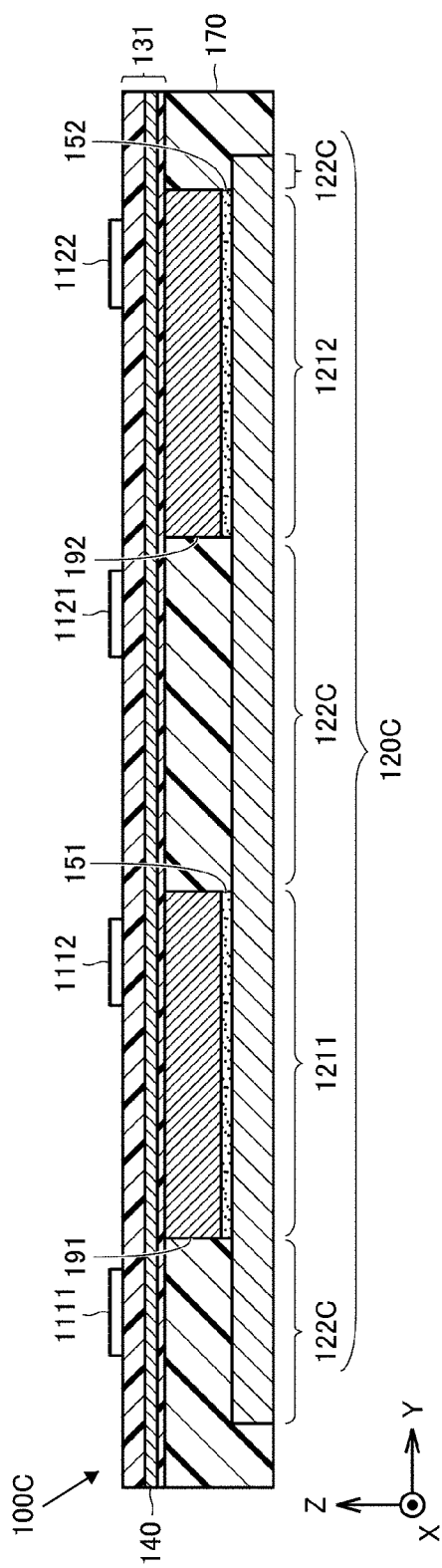
FIG. 7 is a sectional view of an antenna module according to Modification 3 of Embodiment 1.

In Embodiment 1, the case has been described in which the heat dissipation member has two portions having different thicknesses. The heat dissipation member may have a flat plate shape having a uniform thickness like a heat dissipation member 120C of the antenna module 100C according to Modification 3 of Embodiment 1 illustrated in FIG. 7. In the heat dissipation member 120C, the thicknesses of the portions 1211, 1212, and a portion 122C are equal.

As described above, according to the antenna module of Embodiment 1, it is possible to suppress the deviation of the directivity of the radio wave radiated by the antenna module from the desired directivity.

Embodiment 2

In Embodiment 1, the case where the heat dissipation member is fixed to the radio frequency element has been described. It is not necessary to fix the heat dissipation member to the radio frequency element, and the heat dissipation member may be fixed to another component as long as the heat dissipation member is fixed at a position at which the heat of the radio frequency element can be transferred outside. In Embodiment 2, a configuration will be described in which the heat dissipation member is fixed to the dielectric substrate by a plurality of fixing members extending in the laminating direction, thereby suppressing the stress applied to the radio frequency element when attaching the heat dissipation member to the radio frequency element.

Figure 8:
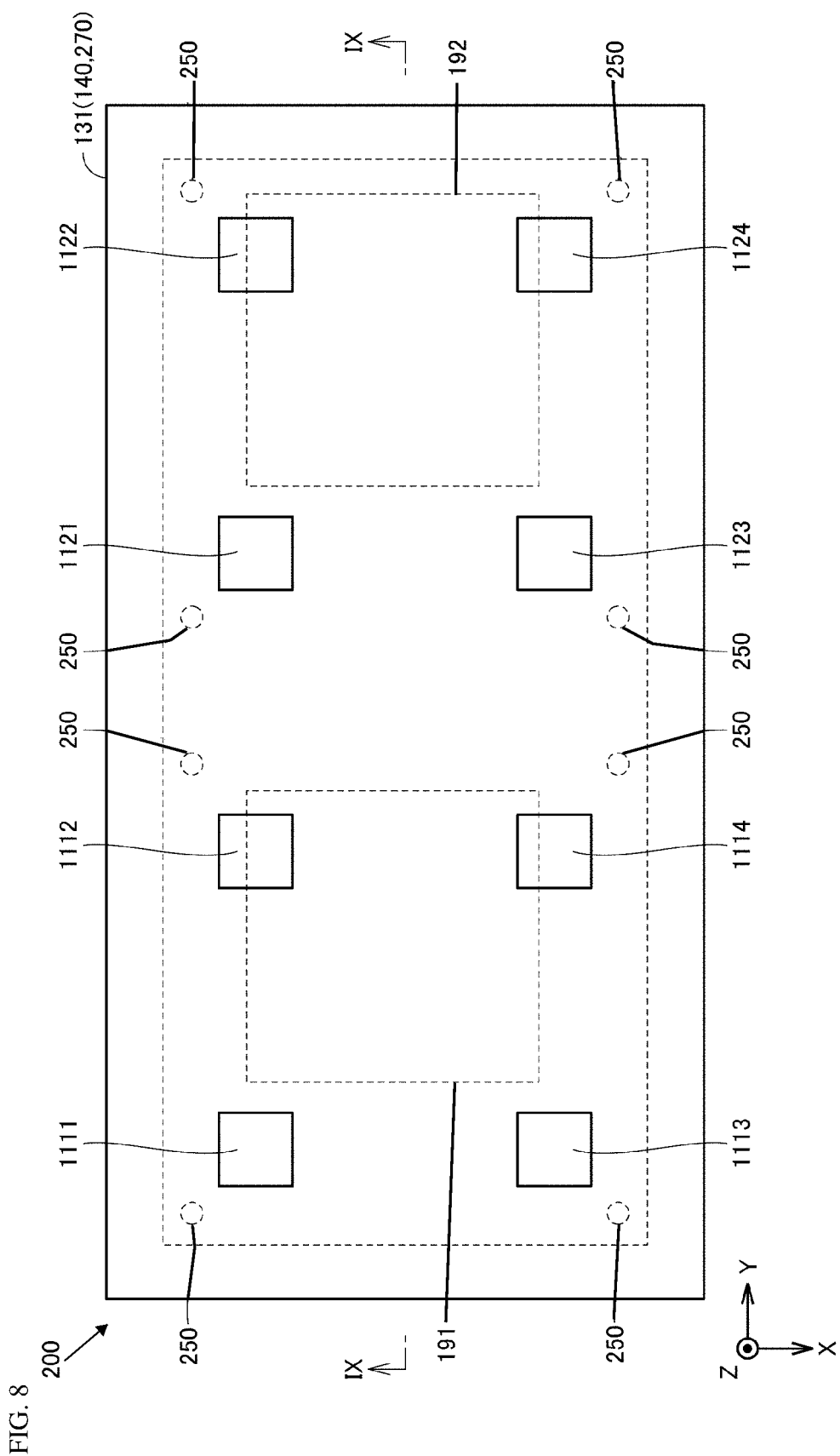
FIG. 8 is a plan view of an antenna module according to Embodiment 2 viewed from a Z-axis direction.
Figure 9:
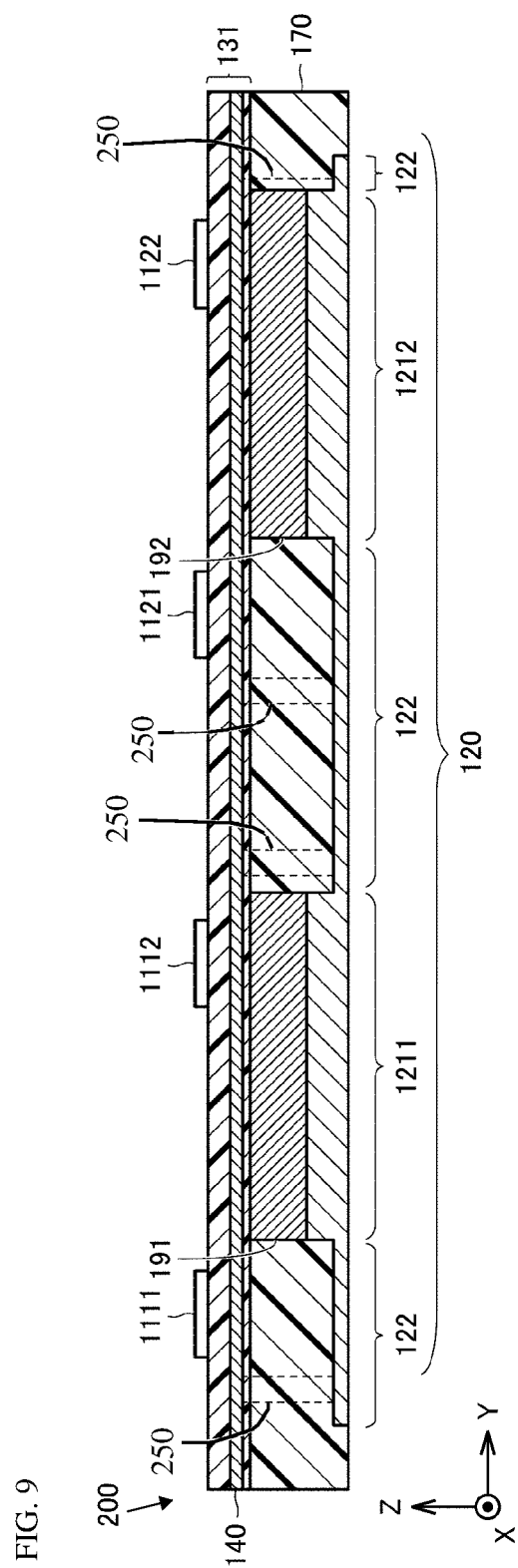
FIG. 9 is a sectional view taken along line IX-IX in FIG. 8.

FIG. 8 is a plan view of an antenna module 200 according to Embodiment 2 viewed from the Z-axis direction. FIG. 9 is a sectional view taken along line IX-IX in FIG. 8. The antenna module 200 is configured such that a plurality of fixing members 250 (first fixing members) is added to the configuration of the antenna module 100 illustrated in FIG. 4 and the adhesive layers 151 and 152 are removed. The components other than those are the same, and therefore, the description thereof will not be repeated.

As illustrated in FIGS. 8 and 9, the plurality of fixing members 250 extend in the Z-axis direction. The heat dissipation member 120 is fixed to the dielectric substrate 131 by the plurality of fixing members 250 at the portion 122. The plurality of fixing members 250 may be an insulator, or may be a conductor such as a via conductor. When the plurality of fixing members 250 is the conductor, the plurality of fixing members 250 can be used as a part of a signal path.

In the antenna module 200, by adjusting a length of the plurality of fixing members 250 in the Z-axis direction, the position of the heat dissipation member 120 can be fixed in a state where the RFICs 191 and 192 and the heat dissipation member 120 are close to or in contact with each other to the extent that no stress is generated between the RFICs 191 and 192 and the portions 1211 and 1212 of the heat dissipation member 120, respectively. Since the stress applied to the RFICs 191 and 192 during manufacturing of the antenna module 200 can be suppressed, the failure rate of the RFICs 191 and 192 can be reduced. As a result, it is possible to improve the yield of the antenna module 200.

As described above, according to the antenna module of Embodiment 2, it is possible to suppress the deviation of the directivity of the radio wave radiated by the antenna module from the desired directivity, and it is possible to improve the yield of the antenna module.

Embodiment 3

In Embodiment 3, a configuration for improving the heat dissipation effect by fixing the heat dissipation member to a heat dissipation electrode of the radio frequency element will be described.

Figure 10:
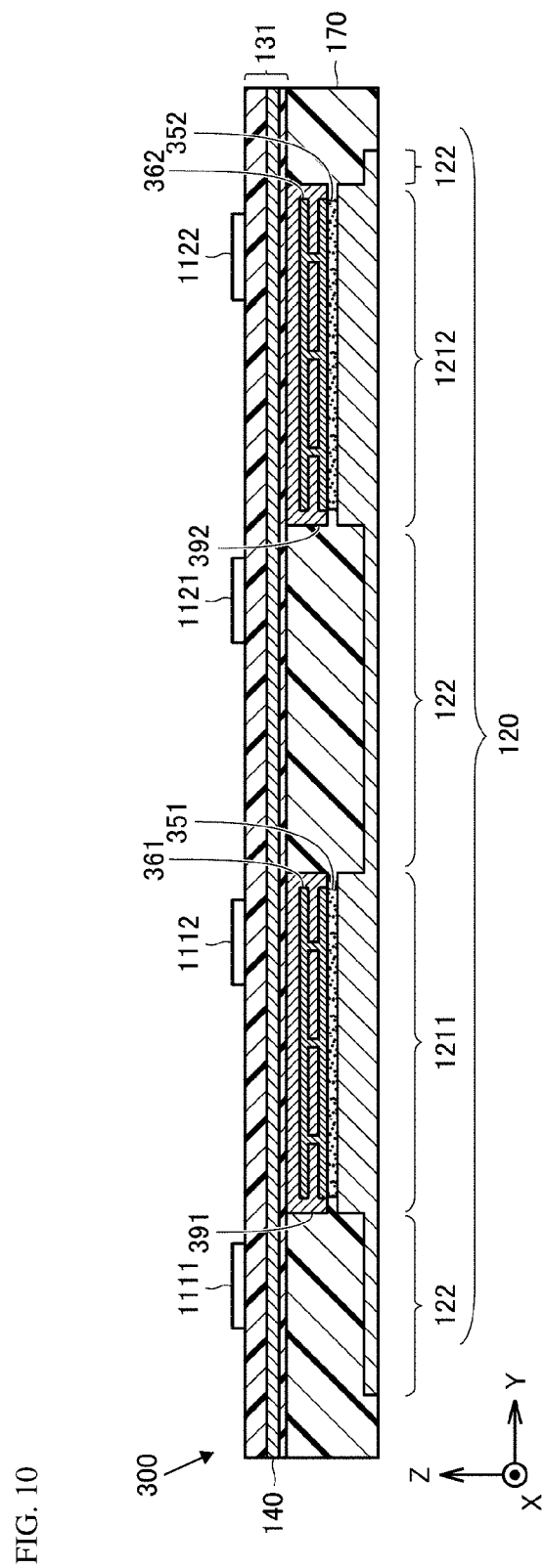
FIG. 10 is a sectional view of an antenna module according to Embodiment 3.

FIG. 10 is a sectional view of an antenna module 300 according to Embodiment 3. The antenna module 300 is configured such that the RFICs 191 and 192 and the adhesive layers 151 and 152 of the antenna module 100 in FIG. 4 are replaced with RFICs 391 and 392 and adhesive layers 351 and 352, respectively, and heat dissipation electrodes 361 and 362 are added. The components other than these are the same, and therefore, the description thereof will not be repeated.

As illustrated in FIG. 10, the RFICs 391 and 392 include the heat dissipation electrodes 361 and 362, respectively. The heat dissipation electrodes 361 and 362 are formed inside the RFICs 391 and 392 once during manufacturing of the RFICs 391 and 392. Parts of the heat dissipation electrodes 361 and 362 are exposed outside the RFICs 391 and 392 by polishing (grinding).

The portion 1211 of the heat dissipation member 120 is fixed to the heat dissipation electrode 361 via the adhesive layer 351. The portion 1212 of the heat dissipation member 120 is fixed to the heat dissipation electrode 362 via the adhesive layer 352.

Heat of the RFIC 391 and heat of the RFIC 392 are mainly transmitted via the heat dissipation electrodes 361 and 362, respectively, to the heat dissipation member 120, and therefore it is possible for the antenna module 300 to efficiently dissipate heat from the RFICs 391 and 392.

As described above, according to the antenna module of Embodiment 3, it is possible to suppress the deviation of the directivity of the radio wave radiated by the antenna module from the desired directivity, and it is possible to efficiently dissipate heat from the radio frequency element.

Embodiment 4

In Embodiments 1 and 3, the configuration has been described in which the heat dissipation member directly receives the heat of the radio frequency element via the adhesive layer. Further, in Embodiment 2, the configuration has been described in which the heat dissipation member directly receives the heat of the radio frequency element. The heat dissipation member does not need to directly receive the heat of the radio frequency element, and may indirectly receive the heat. In Embodiment 4, a configuration in which the heat dissipation member indirectly receives the heat of the radio frequency element through the dielectric substrate will be described.

Figure 11:
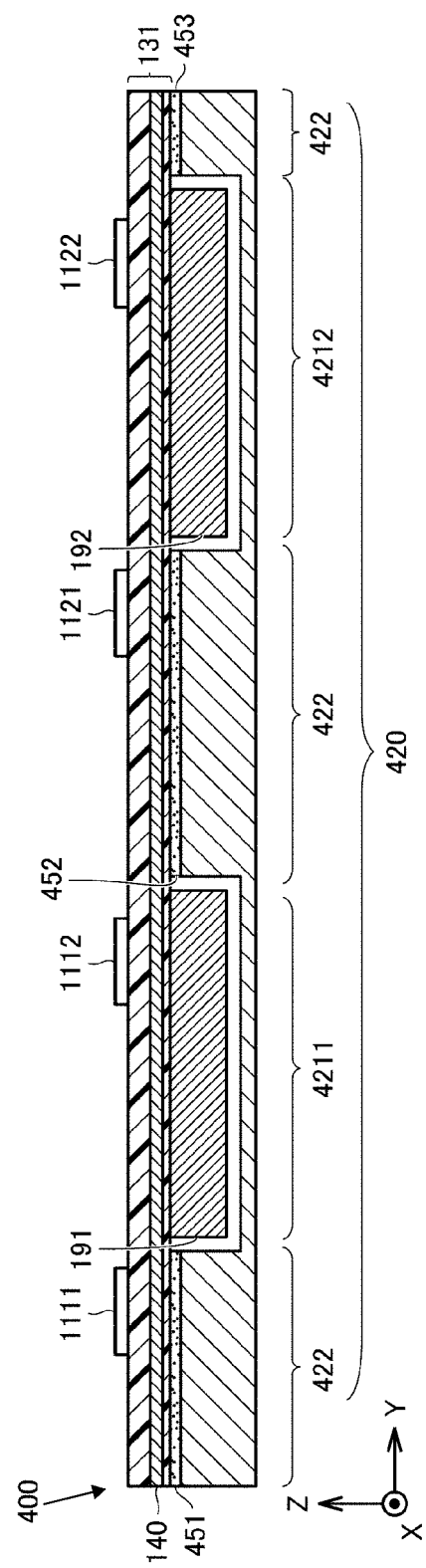
FIG. 11 is a sectional view of an antenna module according to Embodiment 4.

FIG. 11 is a sectional view of an antenna module 400 according to Embodiment 4. The antenna module 400 has a configuration in which the heat dissipation member 120 of the antenna module 100 of FIG. 4 is replaced with the heat dissipation member 420, the adhesive layers 151 and 152 are removed, and adhesive layers 451 to 453 are added. The components other than these are the same, and therefore, the description thereof will not be repeated.

As illustrated in FIG. 11, the heat dissipation member 420 includes a portion 4211 (first portion), a portion 4212 (first portion), and a portion 422 (second portion). The portions 4211 and 4212 overlap the RFICs 191 and 192, respectively, when viewed in plan from the Z-axis direction. The portion 422 does not overlap the RFIC 191 or 192 when viewed in plan from the Z-axis direction. The portion 422 is fixed to the dielectric substrate 131 by the adhesive layers 451 to 453. Thicknesses of the portions 4211 and 4212 in the Z-axis direction are smaller than that of the portion 122. Portions surrounded by the portion 422 and including portions 4211 and 4212, respectively, form concave shapes. The heat dissipation member 420 is arranged to be spaced apart from the RFICs 191 and 192. The space between the heat dissipation member 420 and the RFICs 191 and 192 may not be constant.

In the antenna module 400, the heat dissipation member 420 receives heat of the RFIC 191 and heat of the RFIC 192 transferred to the dielectric substrate 131 from the dielectric substrate 131 and transfers the heat outside the antenna module 400. Further, since the heat dissipation member 420 is arranged to be spaced apart from the RFICs 191 and 192, there is little stress on the RFICs 191 and 192 during manufacturing of the antenna module 400. Therefore, it is possible to reduce the failure rate of the RFICs 191 and 192. As a result, it is possible to improve the yield of the antenna module 400. Further, since the thick portion 422 of the heat dissipation member 420 does not overlap the RFIC 191 or 192 when viewed from the Z-axis direction, it is possible to reduce a height of the antenna module 400.

As described above, according to the antenna module of Embodiment 4, it is possible to suppress the deviation of the directivity of the radio wave radiated by the antenna module from the desired directivity. Further, it is possible to improve the yield of the antenna module and to reduce the height of the antenna module.

Embodiment 5

In Embodiments 1 to 4, the configuration in which the heat dissipation of the plurality of radio frequency elements is performed in common by the heat dissipation member has been described. In Embodiment 5, a communication device having the plurality of antenna modules which are described in Embodiments 1 to 4 will be described. In Embodiment 5, heat from the first heat dissipation member of each antenna module is transferred in common outside the communication device by a second heat dissipation member.

Figure 12:
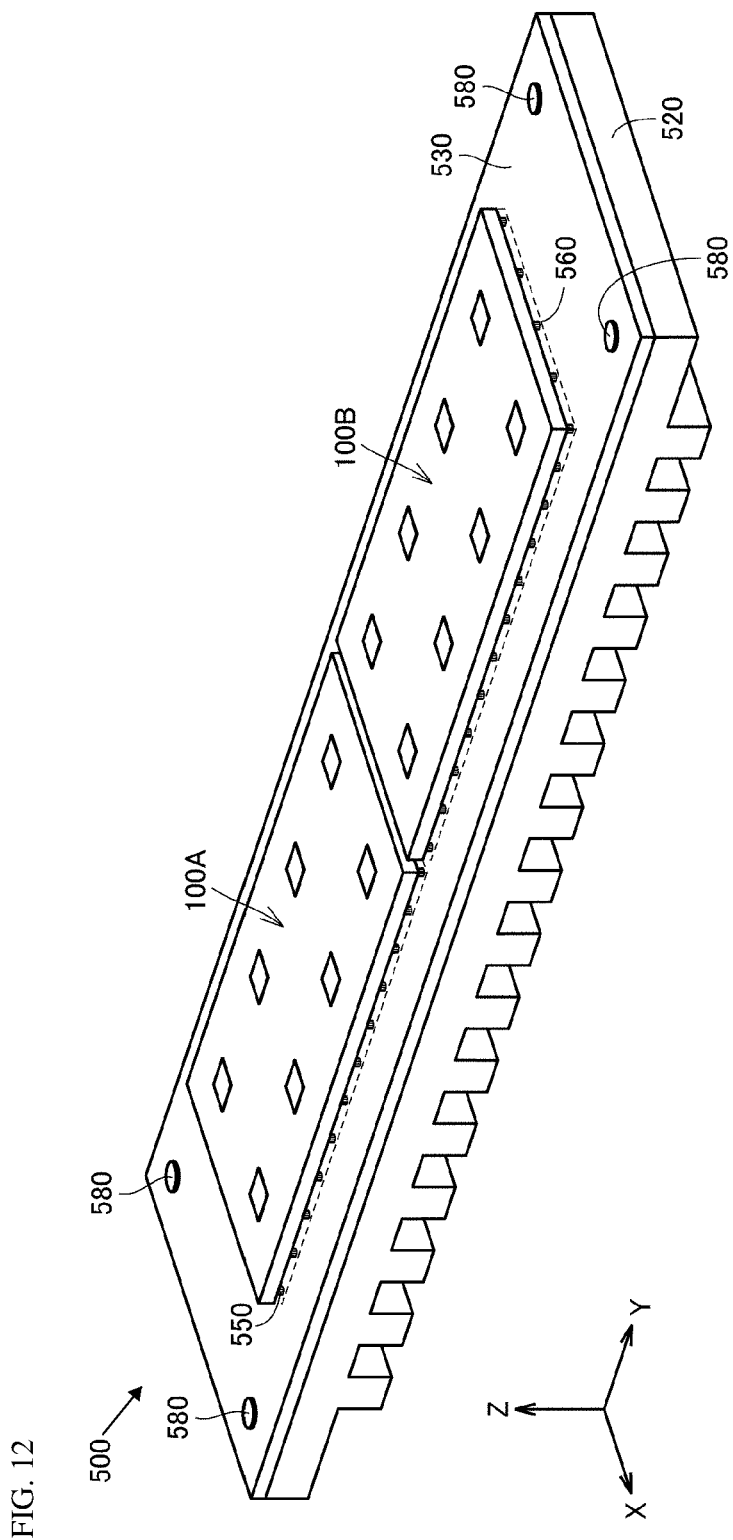
FIG. 12 is an external perspective view of a communication device according to Embodiment 5.

FIG. 12 is an external perspective view of a communication device 500 according to Embodiment 5. As illustrated in FIG. 12, the communication device 500 includes an antenna module 100A (first antenna module), an antenna module 100B (second antenna module), a heat sink 520 (second heat dissipation member), a dielectric substrate 530 (second dielectric substrate) as a mother circuit substrate, a plurality of fixing members 550 (second fixing members), a plurality of fixing members 560 (third fixing members), and a plurality of fixing members 580 (fourth fixing members). In FIG. 12, in order to make the plurality of fixing members 550 and the plurality of fixing members 560 visible, the respective mold layers of the antenna modules 100A and 100B are illustrated by the dotted lines.

The antenna module 100A is fixed to the dielectric substrate 530 by the plurality of fixing members 550 extending in the Z-axis direction. The antenna module 100B is fixed to the dielectric substrate 530 by the plurality of fixing members 560 extending in the Z-axis direction. The dielectric substrate 530 is fixed to the heat sink 520 by the plurality of fixing members 580.

Since the antenna modules 100A and 100B have the same configuration as the antenna module 100 described in Embodiment 1, the description thereof will not be repeated. As the antenna modules 100A and 100B, any one of the antenna modules of Modifications 1 to 3 of Embodiment 1 and Embodiments 2 to 4 may be used.

Figure 13:
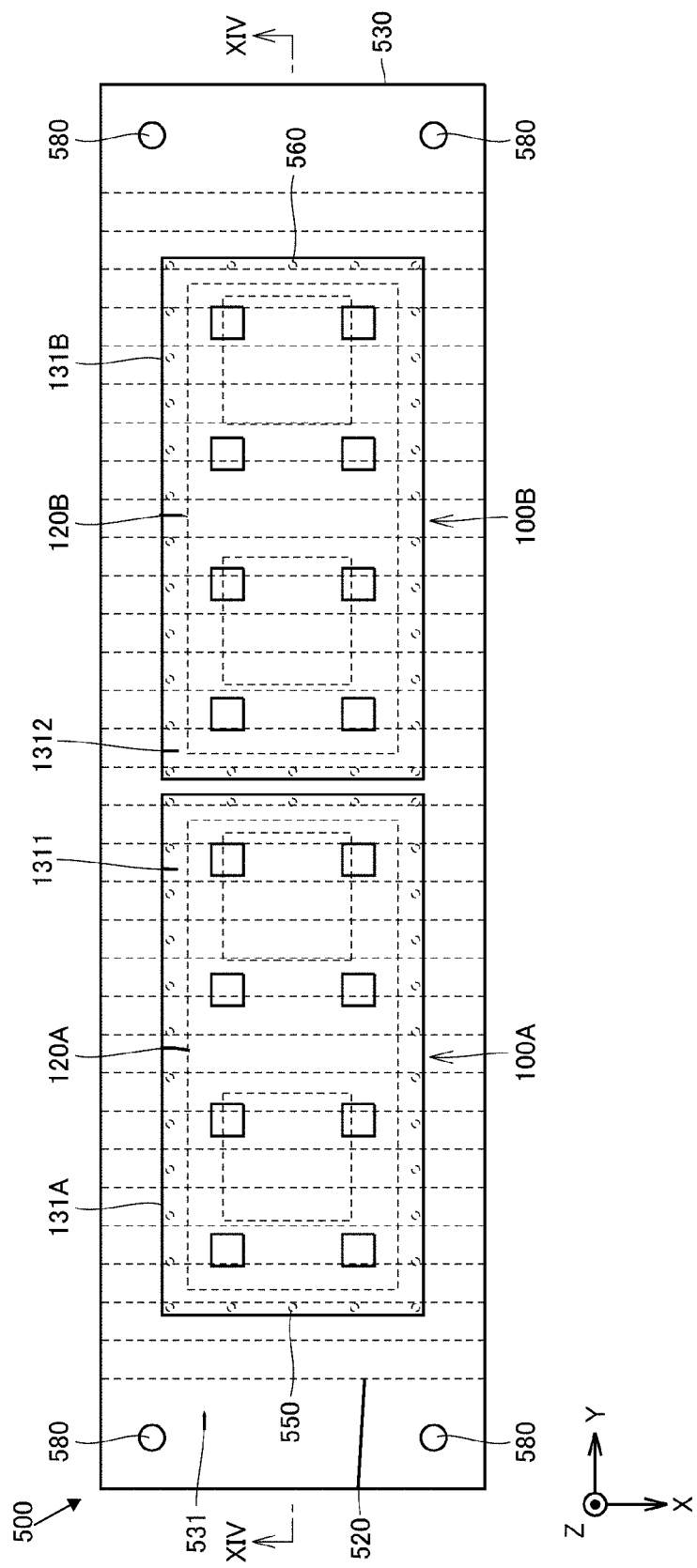
FIG. 13 is a plan view of the communication device in FIG. 12 viewed from the Z-axis direction.
Figure 14:
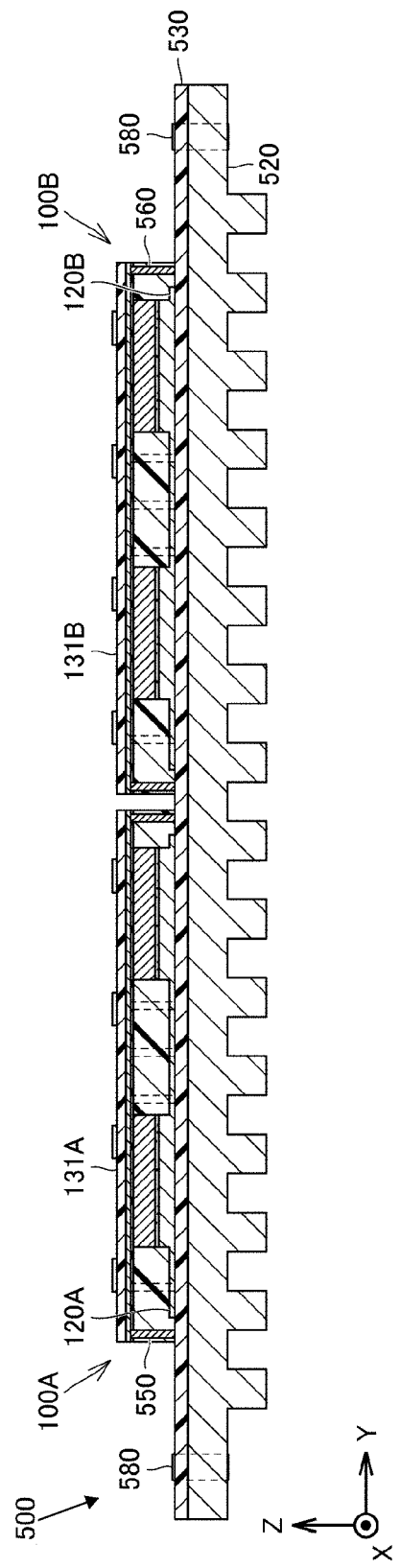
FIG. 14 is a sectional view taken along line XIV-XIV in FIG. 13.

FIG. 13 is a plan view of the communication device 500 in FIG. 12 viewed from the Z-axis direction. FIG. 14 is a sectional view taken along line XIV-XIV in FIG. 13. As illustrated in FIGS. 13 and 14, when viewed in plan from the Z-axis direction, the heat sink 520 overlaps an entirety of a heat dissipation member 120A and an entirety of a heat dissipation member 120B.

In a portion 1311 (third portion) of a dielectric substrate 131A that does not overlap the heat dissipation member 120A when viewed in plan from the Z-axis direction, the dielectric substrate 131A is fixed to the dielectric substrate 530 by the plurality of fixing members 550. In a portion 1312 (fourth portion) of a dielectric substrate 131B that does not overlap the heat dissipation member 120B when viewed in plan from the Z-axis direction, the dielectric substrate 131B is fixed to the dielectric substrate 530 by the plurality of fixing members 560. In a portion 531 (fifth portion) of the dielectric substrate 530 that does not overlap the antenna module 100A or the antenna module 100B when viewed in plan from the Z-axis direction, the dielectric substrate 530 is fixed to the heat sink 520 by the plurality of fixing members 580.

The portion 531 integrally surrounds the antenna module 100A and the antenna module 100B when viewed in plan from the Z-axis direction. When viewed in plan from the Z-axis direction, the plurality of fixing members 580 are arranged so as to integrally surround the antenna module 100A and the antenna module 100B. As a result, it is possible to suppress the influence of the plurality of fixing members 380 on the characteristics of the antenna module 100A and the antenna module 100B such as the directivity.

The heat of the plurality of RFICs included in the antenna modules 100A is transferred outside the antenna modules 100A by the heat dissipation member 120A common to the plurality of RFICs. And similarly, the heat of the plurality of RFICs included in the antenna modules 100B is transferred outside the antenna modules 100B by the heat dissipation member 120B common to the plurality of RFICs. The heat from the heat dissipation member 120A and the heat from the heat dissipation member 120B are transferred outside the communication device 500 by the heat sink 520 common to the heat dissipation members 120A and 120B. Note that a shape of the heat sink 520 is not limited to a shape having an uneven surface illustrated in FIGS. 12 to 14.

In Embodiment 5, the case has been described where the second heat dissipation member common to the plurality of antenna modules is the heat sink. The second heat dissipation member may be a part of a housing that houses the antenna module.

Figure 15:
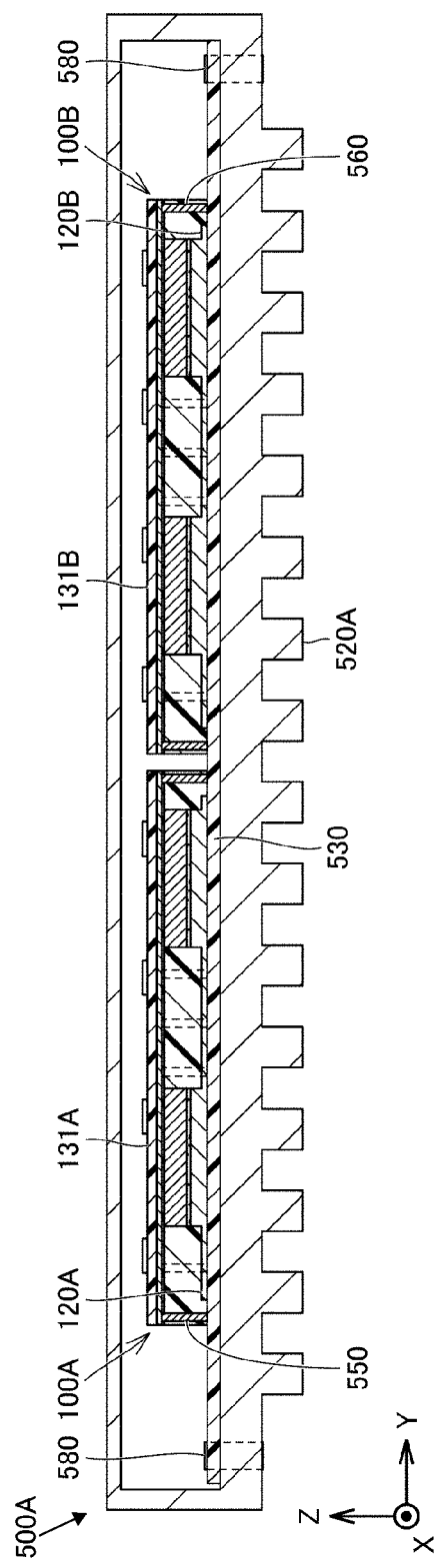
FIG. 15 is a sectional view of a communication device according to a modification of Embodiment 5.

FIG. 15 is a sectional view of a communication device 500A according to a modification of Embodiment 5. The communication device 500A is configured such that the heat sink 520 of the communication device 500 in FIG. 14 is replaced with a housing 520A. The components other than that are the same, and therefore, the description thereof will not be repeated. The housing 520A houses the antenna modules 100A and 100B and the dielectric substrate 530. As with the heat sink 520 in FIG. 14, a portion of the housing 520A to which the dielectric substrate 530 is fixed transfers the heat from the heat dissipation members 120A and 120B outside the communication device 500A. Note that a shape of the housing 520A is not limited to the shape having the uneven surface illustrated in FIG. 15, as with the heat sink 520 illustrated in FIG. 14.

As described above, according to the communication devices of Embodiment 5 and the modification thereof, it is possible to suppress the deviation of the directivity of the radio wave radiated by the antenna module from the desired directivity.

It is also planned that the embodiments disclosed herein will be implemented in an appropriate combination as long as there is no contradiction. It should be understood that the embodiments disclosed herein are illustrative and non-restrictive in every respect. The scope of the present disclosure is indicated by the appended claims rather than by the above description, and it is intended that all modifications within the meaning and scope equivalent to those of the claims are included.

31A, 31D, 33A, 33D, 37 SWITCH
32AR, 32DR LOW NOISE AMPLIFIER
32AT, 32DT POWER AMPLIFIER
34A, 34D ATTENUATOR
35A, 35D PHASE SHIFTER
36 MULTIPLEXER/DEMULTIPLEXER
38 MIXER
39 AMPLIFIER CIRCUIT
100, 100A, 100B, 100C, 200, 300, 400 ANTENNA MODULE
110 ANTENNA ARRAY
120, 120A, 120B, 120C, 420 HEAT DISSIPATION MEMBER 122, 122C, 422, 531, 1211, 1212, 1311, 1312, 4211, 4212 PORTION
131, 131A, 131B, 132, 530 DIELECTRIC SUBSTRATE
140 GROUND ELECTRODE
151, 152, 351, 352, 451, 453 ADHESIVE LAYER
170 MOLD LAYER
191, 192, 391, 392 RFIC
193, 194 CIRCUIT ELEMENT
250, 550, 560, 580 FIXING MEMBER
361, 362 HEAT DISSIPATION ELECTRODE
500, 500A, 1000 COMMUNICATION DEVICE
520 HEAT SINK
520A HOUSING
1111 to 1114, 1121 to 1124 ANTENNA ELEMENT

The invention claimed is:

1. An antenna module configured to radiate a radio wave having directivity by a plurality of radio frequency elements including a first radio frequency element and a second radio frequency element operating in cooperation with each other, the antenna module comprising:
a first dielectric substrate;
a first antenna element provided on a first side of the first dielectric substrate and supplied with a first power from the first radio frequency element provided on a second side of the first dielectric substrate, the first side and second side being different;
a second antenna element provided on the first side of the first dielectric substrate and supplied with a second power from the second radio frequency element provided on the second side of the first dielectric substrate; and
a first heat dissipation member configured to transfer heat from the first radio frequency element and heat from the second radio frequency element to outside, wherein
the first dielectric substrate, the first radio frequency element and the second radio frequency element, and the first heat dissipation member are laminated in this order in a first normal direction normal to the first dielectric substrate, and
the first heat dissipation member overlaps at least a part of the first radio frequency element and at least a part of the second radio frequency element when viewed in plan from the first normal direction.

2. The antenna module according to claim 1, wherein the first heat dissipation member overlaps an entirety of the first radio frequency element and an entirety of the second radio frequency element when viewed in plan from the first normal direction.

3. The antenna module according to claim 2, wherein, a thickness in the first normal direction of a first portion of the first heat dissipation member overlapping the first radio frequency element or the second radio frequency element when viewed in plan from the first normal direction is larger than a thickness in the first normal direction of a second portion of the first heat dissipation member not overlapping the first radio frequency element or the second radio frequency element when viewed in plan from the first normal direction.

4. The antenna module according to claim 2, wherein
a thickness in the first normal direction of a first portion of the first heat dissipation member overlapping the first radio frequency element or the second radio frequency element when viewed in plan from the first normal direction is smaller than a thickness in the first normal direction of a second portion of the first heat dissipation member not overlapping the first radio frequency element or the second radio frequency element when viewed in plan from the first normal direction, and
the second portion is fixed to the first dielectric substrate.

5. The antenna module according to claim 2, wherein
the first radio frequency element includes a heat dissipation electrode exposed outside the first radio frequency element, and
the first heat dissipation member is fixed to the heat dissipation electrode.

6. The antenna module according to claim 1, wherein, a thickness in the first normal direction of a first portion of the first heat dissipation member overlapping the first radio frequency element or the second radio frequency element when viewed in plan from the first normal direction is larger than a thickness in the first normal direction of a second portion of the first heat dissipation member not overlapping the first radio frequency element or the second radio frequency element when viewed in plan from the first normal direction.

7. The antenna module according to claim 6, wherein the first portion is fixed to the first radio frequency element or the second radio frequency element.

8. The antenna module according to claim 7, wherein the first heat dissipation member is fixed to the first dielectric substrate at the second portion by a plurality of first fixing members extending in the first normal direction.

9. The antenna module according to claim 7, wherein
the first radio frequency element includes a heat dissipation electrode exposed outside the first radio frequency element, and
the first heat dissipation member is fixed to the heat dissipation electrode.

10. The antenna module according to claim 6, wherein the first heat dissipation member is fixed to the first dielectric substrate at the second portion by a plurality of first fixing members extending in the first normal direction.

11. The antenna module according to claim 10, wherein
the first radio frequency element includes a heat dissipation electrode exposed outside the first radio frequency element, and
the first heat dissipation member is fixed to the heat dissipation electrode.

12. The antenna module according to claim 6, wherein
the first radio frequency element includes a heat dissipation electrode exposed outside the first radio frequency element, and
the first heat dissipation member is fixed to the heat dissipation electrode.

13. The antenna module according to claim 1, wherein
a thickness in the first normal direction of a first portion of the first heat dissipation member overlapping the first radio frequency element or the second radio frequency element when viewed in plan from the first normal direction is smaller than a thickness in the first normal direction of a second portion of the first heat dissipation member not overlapping the first radio frequency element or the second radio frequency element when viewed in plan from the first normal direction, and
the second portion is fixed to the first dielectric substrate.

14. The antenna module according to claim 13, wherein the first heat dissipation member is fixed to the first dielectric substrate at the second portion by a plurality of first fixing members extending in the first normal direction.

15. The antenna module according to claim 13, wherein
- the first radio frequency element includes a heat dissipation electrode exposed outside the first radio frequency element, and
- the first heat dissipation member is fixed to the heat dissipation electrode.

16. The antenna module according to claim 1, wherein
- the first radio frequency element includes a heat dissipation electrode exposed outside the first radio frequency element, and
- the first heat dissipation member is fixed to the heat dissipation electrode.

17. A communication device comprising:
- a first antenna module and a second antenna module, each of the first antenna module and the second antenna module being the antenna module according to claim 1;
- a second dielectric substrate, the first antenna module and the second antenna module being mounted on the second dielectric substrate; and
- a second heat dissipation member configured to transfer heat from the first heat dissipation member of the first antenna module and heat from the first heat dissipation member of the second antenna module outside, wherein
- the first antenna module and the second antenna module, the second dielectric substrate, and the second heat dissipation member are laminated in this order in the first normal direction, and
- when viewed in plan from the first normal direction, the second heat dissipation member overlaps an entirety of the first heat dissipation member of the first antenna module and an entirety of the first heat dissipation member of the second antenna module.

18. The communication device according to claim 17, wherein
- at a third portion of a first dielectric substrate of the first antenna module not overlapping the first heat dissipation member of the first antenna module when viewed in plan from the first normal direction, the first dielectric substrate of the first antenna module is fixed to the second dielectric substrate by a plurality of second fixing members extending in the first normal direction,
- at a fourth portion of a first dielectric substrate of the second antenna module not overlapping the first heat dissipation member of the second antenna module when viewed in plan from the first normal direction, the first dielectric substrate of the second antenna module is fixed to the second dielectric substrate by a plurality of third fixing members extending in the first normal direction, and
- at a fifth portion of the second dielectric substrate not overlapping the first antenna module or the second antenna module when viewed in plan from the first normal direction, the second dielectric substrate is fixed to the second heat dissipation member by a plurality of fourth fixing members extending in the first normal direction.

19. The communication device according to claim 17, wherein
- at a fifth portion of the second dielectric substrate not overlapping the first antenna module or the second antenna module when viewed in plan from the first normal direction, the second dielectric substrate is fixed to the second heat dissipation member by a plurality of fourth fixing members extending in the first normal direction, and
- the fifth portion integrally surrounds the first antenna module and the second antenna module when viewed in plan from the first normal direction.

20. The communication device according to claim 17, wherein
- the second heat dissipation member is a part of a housing, and
- the housing houses the first antenna module, the second antenna module, and the second dielectric substrate.

\* \* \* \* \*